United States Patent [19]

Morano

[11] Patent Number: 5,430,396
[45] Date of Patent: Jul. 4, 1995

[54] BACKPLANE BUS FOR DIFFERENTIAL SIGNALS

[75] Inventor: David A. Morano, Middletown Township, Monmouth County, N.J.

[73] Assignee: AT&T Corp., Murray Hills, N.J.

[21] Appl. No.: 281,048

[22] Filed: Jul. 27, 1994

[51] Int. Cl.6 ............... H03K 19/0175; H03K 19/082
[52] U.S. Cl. ........................................ 326/90; 326/89; 326/30
[58] Field of Search ............. 326/90, 89, 30, 77; 375/36

[56] References Cited

U.S. PATENT DOCUMENTS

| | | | |
|---|---|---|---|
| 3,723,761 | 3/1973 | Masaki | 326/90 |
| 3,760,200 | 9/1973 | Taniguchi et al. | 326/90 |
| 4,710,943 | 12/1987 | Duley et al. | 375/36 |
| 4,994,690 | 2/1991 | Sundstrom et al. | 326/90 |
| 5,093,587 | 3/1992 | Zbinden | 326/90 |
| 5,142,168 | 8/1992 | Matsunaga | 326/90 |
| 5,220,211 | 6/1993 | Christopher et al. | 326/90 |

*Primary Examiner*—Edward P. Westin
*Assistant Examiner*—Richard Rosen

[57] ABSTRACT

A differential voltage bus system is disclosed wherein the two leads of the bus are biased by the termination networks with a predetermined voltage difference representing a digital signal of one binary type. The bus driver in each bus master connects a current source to one of the two bus leads and a current sink to the other of the two bus leads in response to an input digital signal of the other binary type thereby changing the voltage difference on the bus to represent the other binary type. In response to an input digital signal of the first-mentioned binary type, the bus driver isolates the current source and sink from the bus and connects them together in order to decrease the detrimental effect of transients. The selective switching in the bus driver is performed by MOSFET switches which are driven by buffer driver circuits each of which uses a combination of MOSFETs and an NPN transistor to drive its respective MOSFET switch with a high peak current thereby enabling rapid switching. The current source and sink in the bus driver also uses a combination of MOSFETs and NPN transistors in order to permit operation of the bus a low voltage levels.

10 Claims, 10 Drawing Sheets

BACKPLANE BUS FOR DIFFERENTIAL SIGNALS

FIELD OF THE INVENTION

This invention relates to backplane busses and more particularly to backplane busses which utilize the difference in voltage between two signal paths to transmit each digital bit.

DESCRIPTION OF THE RELATED ART

A typical prior art differential bus for ECL (emitter coupled logic) consists of differential leads that must be isolated from the bus when a master is not using the bus. The ECL bus achieves this isolation by using a third output state of the driver which is a high impedance isolation state. When using ECL type signal levels, both signal paths are biased equally to an appropriate ECL termination voltage which is normally 2 volts below the top rail voltage. With this termination bias arrangement, an unbalanced signal wave will propagate when going into or out of the high impedance isolation condition. Since the first bit that is driven after coming out of the isolation condition propagates as an unbalanced wave, its electrical characteristics are significantly poorer than a differentially driven signal. This causes a constraint that limits the speed of the bus.

Another difficulty with ECL is that it does not provide a boolean function on the bus which can be used for arbitration and control functions. If one bus master asserts a logic zero while another bus master asserts a logic one in ECL, the signal on the bus is undefined and the output is simply noise. Single ended buses such as TTL do provide a boolean function but as pointed out hereinabove such buses suffer from high power or lack of noise immunity.

Still another difficulty with commonly used interface technologies, such as TTL, PECL, ECL, BTL, and GTL, is that they use voltage mode bus drivers which drive the bus to certain predetermined voltages to represent the logic states. As the speed requirement in buses for telecommunications applications increases, the time slot period for one bit approaches the amount of time that a signal edge takes to traverse a fraction of the backplane length. As a result, the last digital bit from one of the masters can be passing a second master on the bus when it is time for that second master to begin transmission. If the second master sees the digital value on the bus which it intends to transmit, the voltage mode bus driver from that second master will not contribute to the bus until that last bit from the first master is ended. This causes the bus driver in the second master to produce a first digital bit with less than the full time slot period, and this short digital bit typically cannot be properly received.

SUMMARY OF THE INVENTION

The problems pointed out hereinbefore with respect to prior art backplane buses are solved in accordance with the present invention wherein a backplane bus for differential signals is provided wherein two transmission paths are provided by two signal leads for each of the digital bits to be transmitted on the bus. The two transmission paths provided by the two signal leads for each one of the digital bits are terminated with their characteristic impedances by a network at each end of the signal leads, and these networks bias the two signal leads with a different DC voltage on each one of the two leads. This normally present DC voltage difference between the two leads represents one of the two binary digital states. Digital information is coupled to the bus for each digital bit to the corresponding two signal leads through a current mode bus driver which couples current into one of the leads and out of the other one of the leads in response to the other one of the two binary digital states, thereby changing the difference in voltage between the two leads. Digital information for each bit is coupled out of the bus by a voltage differential receiver connected between the two signal leads.

One aspect of the present invention is that the termination network at each end of the signal leads provides the proper terminating impedance and the two different DC voltages from a single voltage source power supply. In one embodiment of the network, first, second, and third resistors are connected in series across the single voltage source, a fourth resistor is connected between one of the signal leads and the junction of the first and second resistors, and a fifth resistor is connected between the other signal lead and the junction of the second and third resistors.

In another embodiment of the termination network, four resistors are connected in a bridge arrangement with a single voltage source connected to two of the opposite nodes of the bridge, and the transmission paths are connected in parallel with a fifth resistor across the other two opposite nodes of the bridge.

DESCRIPTION OF THE PREFERRED EMBODIMENT

Figure 1:
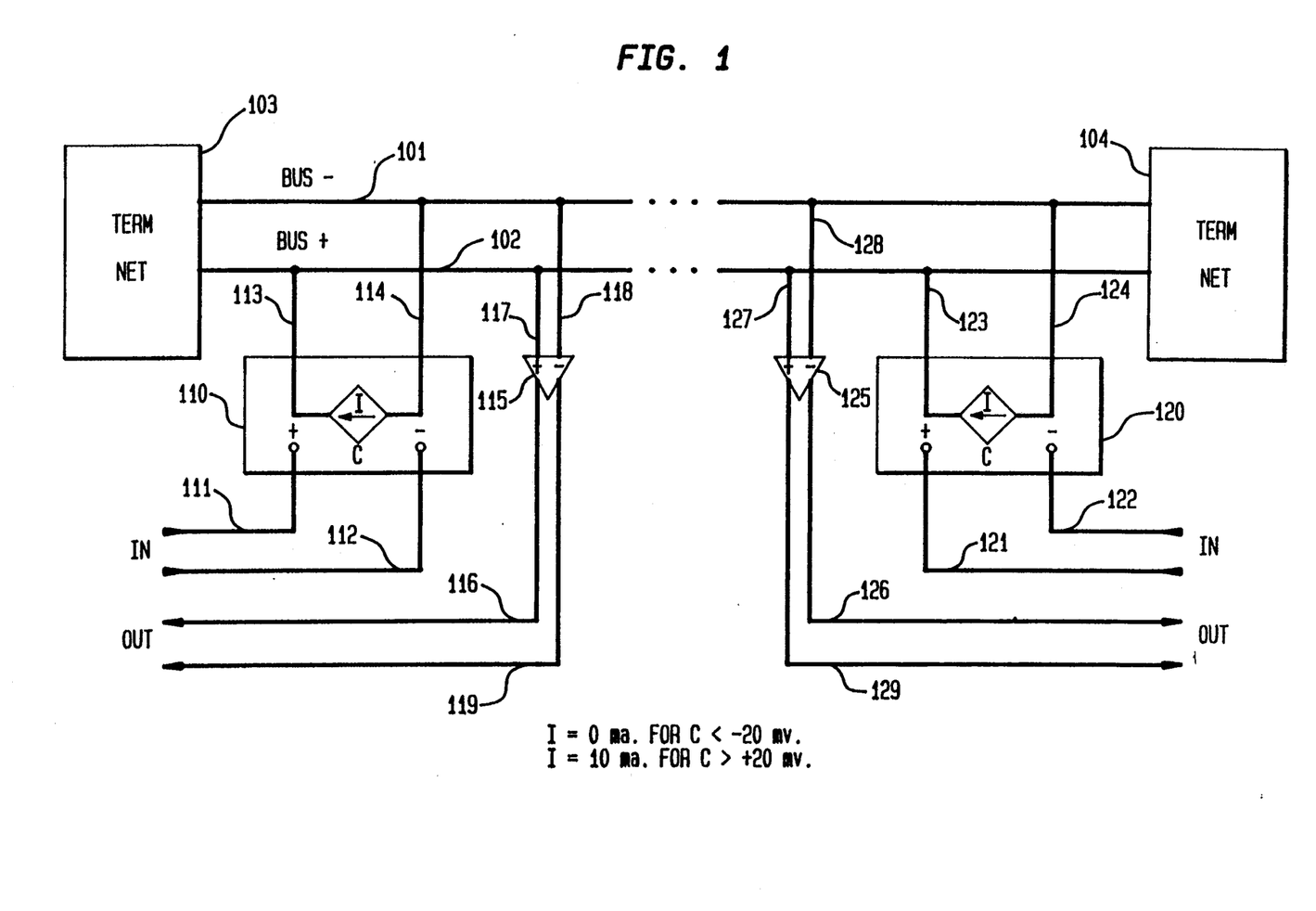
FIG. 1 is a schematic block diagram of a backplane bus for differential signals constructed in accordance with the present invention.

The essential elements of a backplane bus constructed in accordance with the present invention is shown in schematic block diagram form in FIG. 1. In FIG. 1, signal leads 101 and 102 are connected between termination networks 103 and 104. Signal leads 101 and 102 in FIG. 1 are not only terminated in their proper characteristic impedances by termination networks 103 and 104, but are also presented by these networks with a different D.C. bias potential on each of the signal leads. In accordance with the embodiment shown, bias voltages were chosen such that the "+" lead is more negative than the "−" lead in the idle state, that is, when the bus is not being driven by apparatus to be described hereinafter. In the case where the signal leads are not being driven, the idle state of the bus with lead 101 more positive than lead 102 is arbitrarily defined as a logic zero state. Accordingly, a differential amplifier 115 in FIG. 1, having its positive input connected by way of line 117 to lead 102, and its negative input connected by way of line 118 to lead 101, will provide a digital zero at its output on lines 116 and 119 when the leads 101 and 102 are in the idle state.

Also connected to lead 101 and 102 is current mode bus driver 110. The characteristics of current mode bus driver 110 are given by the equations shown in FIG. 1. As indicated by the equations, current mode bus driver 110 provides a current source of 10 ma. (milliamps) by way of line 113 into lead 102 and simultaneously provides a current sink of 10 ma. by way of line 114 for lead 101 when the input voltage, C, to the bus driver is greater than 20 mv. If the input voltage, C, is less than −20 mv. (millivolts), the bus driver has an output of 0 ma., that is, it does not drive the signal leads. As pointed out hereinafter, driving a current of 10 ma. into lead 102 and out of lead 104 causes the relative potential between the two signal leads to switch with signal lead 102 now being more positive than signal lead 101. This potential shift causes differential receiver 115 to provide a digital one at its output.

A current mode bus driver circuit 120 (identical to bus driver circuit 110) and a differential amplifier 125 (identical to differential amplifier 115) are shown in FIG. 1 as being connected to other points along the bus provided by signal leads 101 and 102 to represent other boards or bus masters along the bus. Accordingly, a differential digital input signal coupled by way of lines 111 and 112 to the input of the bus driver 110 will be read at the output of differential amplifiers, such as differential amplifier 125, which are positioned along another points of the bus.

Figure 2:
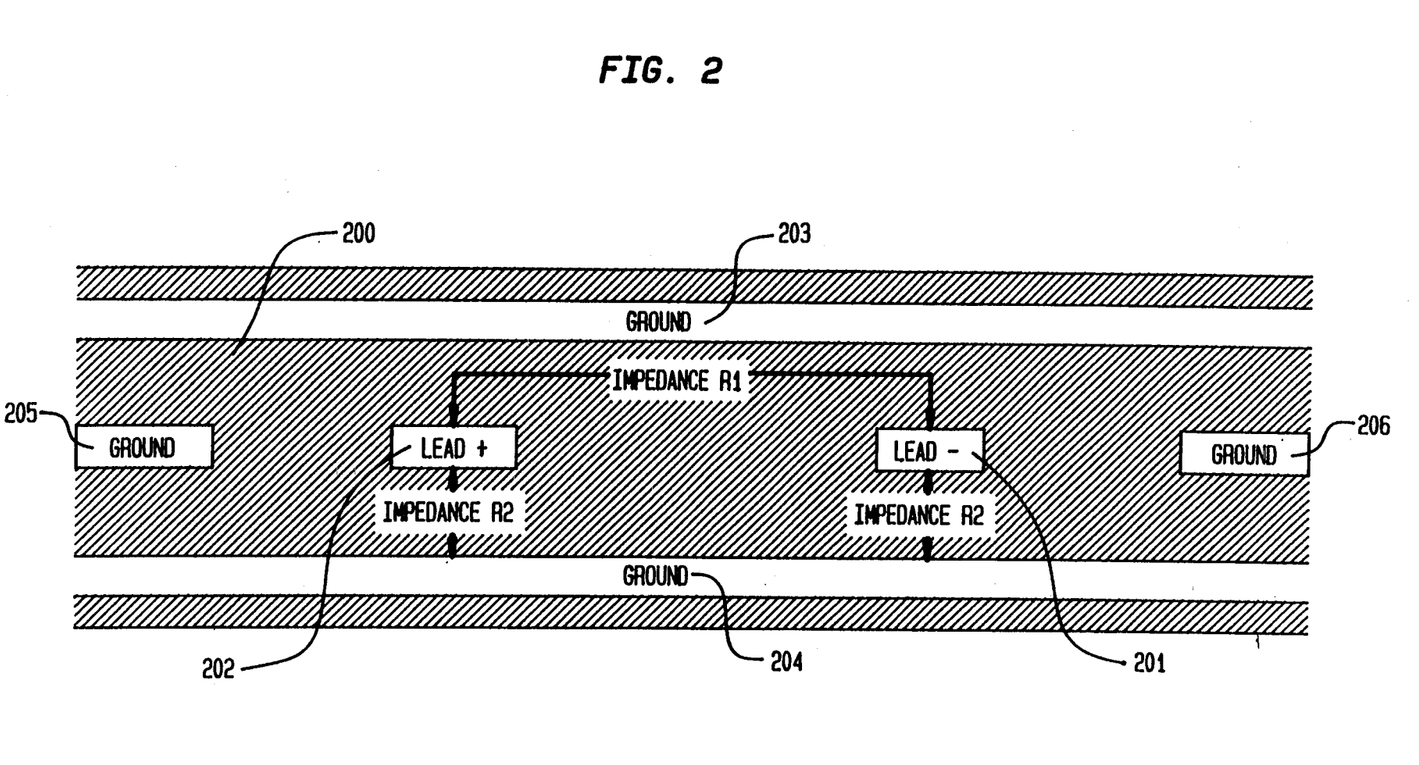
FIG. 2 is cross-sectional diagram of a portion of a circuit board which is fabricated to provide the leads which serve as the bus in the circuit shown in FIG. 1.

The invention will be more thoroughly understood after the following more complete description of the fabrication of the signal leads, the termination networks, and the current mode bus driver. Signal leads 101 and 102 are typically manufactured by using a strip line design embedded within a circuit board made of a dielectric (usually FR4). FIG. 2 shows a partial cross-sectional view of a circuit board with strip lines embedded in a dielectric 200. In FIG. 2, signal leads 101 and 102 are provided by metallic leads 201 and 202 respectively, which leads are surrounded in the circuit board by metallic ground planes 203 and 204 and by metallic ground strip lines 205 and 206. FIG. 2 is not drawn to any particular scale, but strip lines of this type can be manufactured with trace widths of five thousandths of an inch with separations between them of six thousandths of an inch.

As will be appreciated by those skilled in the art, the elements shown are useful in processing a single digital bit at any given time. Although signal leads 101 and 102 are labeled in FIGS. 1 as BUS− and BUS+ respectively, they will generally be duplicated in pairs for any bus system which processes more than one bit at a time. For example, in a backplane bus where 8 digital bits are transmitted at a time, the entire backplane system would have seven more circuits of the type shown in FIG. 1. Accordingly, the pattern of strip lines shown in FIG. 2 may be repeated in the circuit board as many times as necessary in order to provide two leads for each of the digital bits to be transmitted simultaneously on the bus system with each pair of leads being surrounded by the ground planes and ground strip lines.

Leads 201 and 202 are in essence waveguides which are capable of transmitting two types of transverse electromagnetic (TEM) wave propagation modes. The two wave propagation modes are usually referred to by those skilled in the art as the even mode and the odd mode. Even mode waves propagate using the wave guide formed by one of the leads and the surrounding environment (usually the A.C. ground). Odd mode waves propagate using a wave guide formed only by the two signal leads. Each wave propagation mode sees a different transmission line impedance.

Even mode waves see a characteristic impedance formed by the impedance between each of the signal leads and that lead's surroundings. This impedance is illustrated as impedance R2 in FIG. 2. This impedance is referred to as the even mode impedance of the wave guide and is denoted as $Z_{even}$. The impedance R2 in FIG. 2 is not just the impedance from the signal lead to an adjacent A.C. ground plane, but instead represents an impedance made up of all of the surrounding elements around the lead including both ground planes and the adjacent ground trace. Of course, the impedance is also affected by the dielectric 200 used in the manufacture of the guide structure. This impedance R2 does not include a component due to the adjacent complementary signal lead such as represented by impedance R1 in FIG. 2. This component is factored into the odd mode impedance of the guide instead. Thus $Z_{even}$ equals R2 for the purposes of this illustration. The wave guide structure depicted in FIG. 2 is designed such that each signal lead in the pair forms the same even mode impedance with the surrounding elements.

The guide current component for a purely common mode signal traveling down the guide will be evenly divided between each of the two signal leads. This can be likened to two waves (each with one half of the current component of a single one) traveling down two guides. Each of these virtual component waves will have the same electric field strength as the single common mode wave (same voltage developed across the guide walls) but will each only have a guide wall current of one half of the single common mode wave guide current. Each of these individual waves propagates through what appears to be its own waveguide with a characteristic impedance equal to the even mode impedance, $Z_{even}$. In this way, the single common mode signal wave can be thought of as traveling trough a wave guide with a characteristic impedance of one half the even mode impedance ($Z_{even}/2$) or two $Z_{even}$ impedances in parallel.

Odd mode waves are affected only by an impedance referred to as the odd mode impedance, $Z_{odd}$. This impedance is made up of both the impedances R1 and R2 as illustrated in FIG. 2. When considering the geometry of the traces in FIG. 2, this impedance is simply calculated as one half of the impedance derived by R1 in parallel with two times R2. This reduces to the following equation:

$$Z_{odd} = \frac{R1 \times R2}{R1 + (2 \times R2)}$$

As with the even mode impedance above, each lead in the differential pair forms its own odd mode characteristic impedance between itself and what can be viewed as a virtual wave guide coupling barrier or wall. This virtual wave guide barrier lies along an equal-potential plane of the electric field coupled between the two signal leads and further exists at the midpoint electric field potential between the two signal leads. A purely odd mode wave traveling down the guide will experience a wave guide characteristic impedance of $2 \times Z_{odd}$ or two $Z_{odd}$ impedances in series.

Since the power in a propagated wave (TEM mode) is proportional to the square of the voltage swing, it is desirable to reduce voltage swings wherever possible in order to conserve power. Voltage swings cannot be arbitrarily reduced however, since reduced voltage swings also decreases the noise immunity of the propagated signal from stray induced transients. In the present embodiment, the current mode bus drivers are designed to operate with a bus idle difference voltage centered about 1.2 volts with a total swing of 0.25 volts (each lead swings a total of 0.125 volts). The differential amplifiers such as 115 and 125 are designed to receive a voltage difference signal centered around 1.2 volts.

Figure 6:
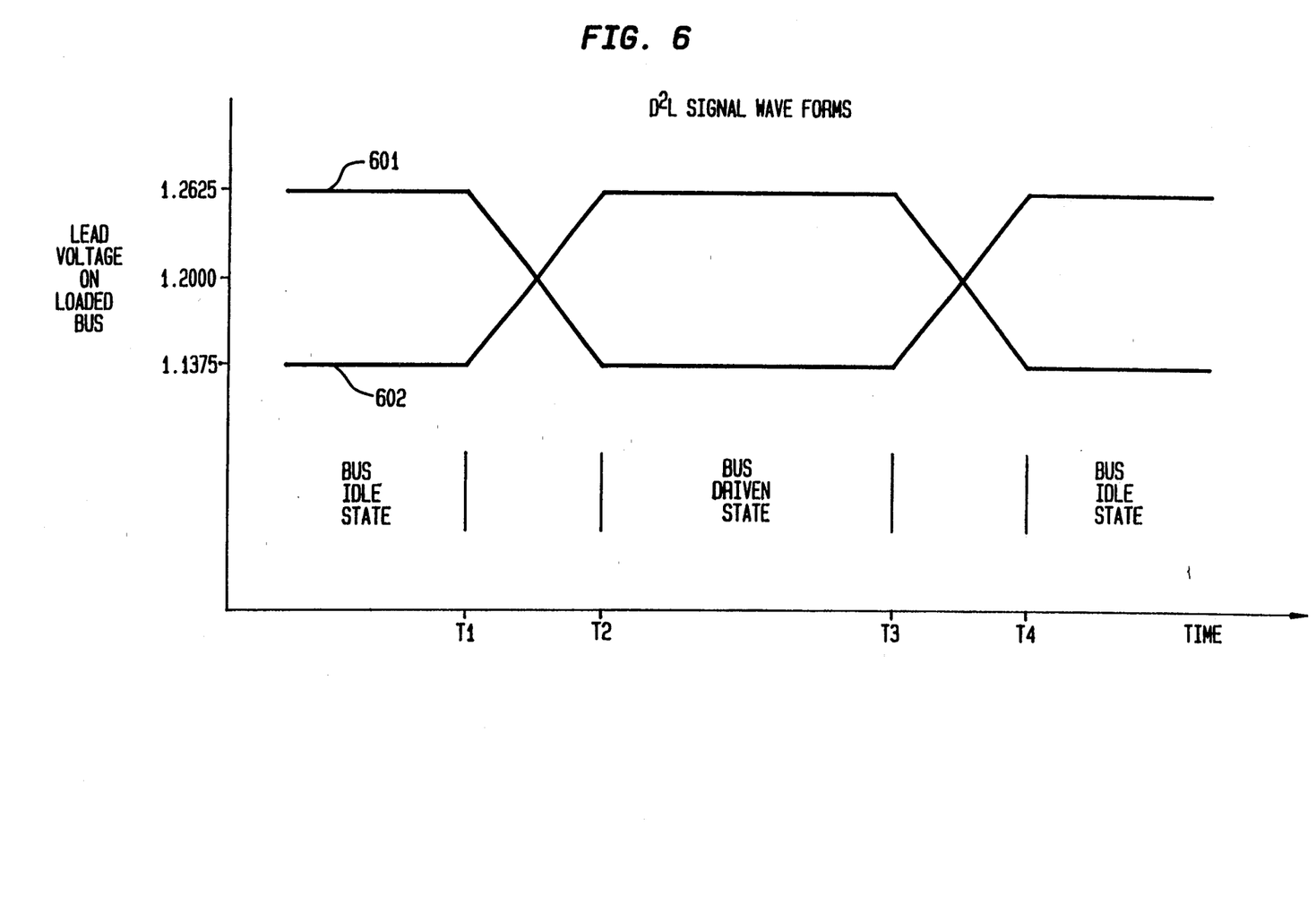
FIG. 6 is a representation of the voltage waveforms versus time present on the leads of FIG. 1.

In order to ensure that the differential amplifiers 115 and 125 recognize the logic states (zero and one) with an equal margin for cross-talk and noise immunity in each logic state, the voltage difference between the signal leads 101 and 102 in the idle bus state is set equal to one half of the total signal voltage swing of the differential pair. Lead voltages in the present embodiment are shown in FIG. 6. To distinguish this differential logic system in FIG. 6 from other differential logic systems such as ECL and PECL, my colleagues have designated this system as D²L (Dave's Differential Logic). In FIG. 6, waveform 601 shows the voltage versus time on lead 101 (BUS−), and waveform 602 shows the voltage versus time for lead 102 (BUS+). As indicated in FIG. 6, during the bus idle state up to time T1, lead 101 is at a voltage 0.125 volts higher than lead 102. Whereas after the transition between T1 and T2, when the bus is being driven between the times T2 and T3, lead 102 is higher in voltage than lead 101 by 0.125 volts. Accordingly, the difference in voltage between the leads is in both instances equal to 0.125 volts which is one half of the total swing voltage of 0.250 volts.

As pointed out herein above, a purely odd mode wave traveling down the guide will experience a wave guide characteristic impedance of $2 \times Z_{odd}$. In the embodiment constructed, two times the characteristic impedance, $Z_{odd}$, is about 100 ohms, and the loaded bus impedance is assumed to be one half of this value or about 50 ohms. As pointed out herein above, the voltage difference between the signal leads 101 and 102 in the idle bus state is equal to 0.125 volts and the total voltage swing is equal to 0.25 volts. To propagate this 0.25 voltage swing in the odd mode in one direction along the bus into the loaded bus impedance of 50 ohms requires a total current, $I_{total}$, of $(0.25/50=)$ 5 ma. Since the bus driver must propagate a wave in each direction, the total current required is equal to two times the 5 ma. or 10 ma.

As will be appreciated by those skilled in the art, one could just as well compute the difference in voltage between the idle bus leads from a knowledge of the value of current that can be provided by a given current mode bus driver. This value of current can be used to compute the total voltage swing into the loaded bus impedance, thereby giving the difference in voltage between the idle bus leads since it is one half the total voltage swing.

A termination network is always required on both ends of the bus if reflections are to be reduced or eliminated. Conventional prior art networks for differential bus pairs have always biased both leads of the pair with the same Thevenin equivalent voltage. In accordance with the present invention, the termination network advantageously provides a unique bias voltage to each of the signal leads. This is what gives rise to an idle state of the bus which can be used to represent one of the two desired logic states.

Figure 3:
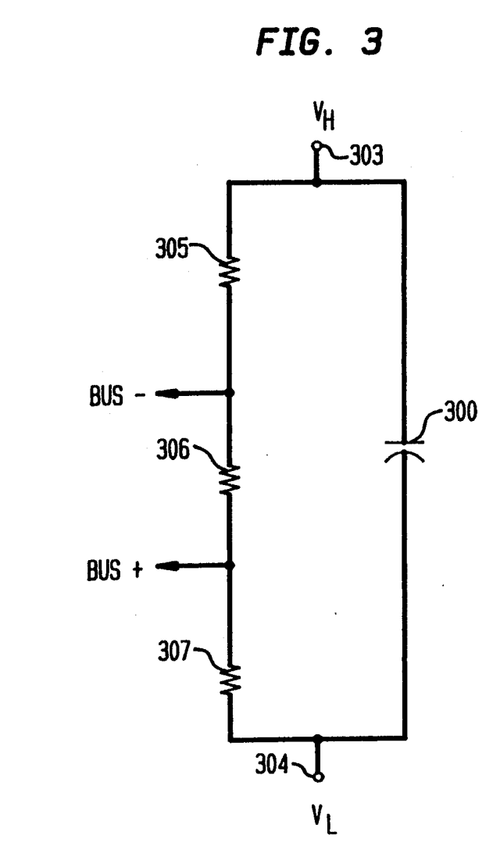
FIGS. 3, 4, and 5 are schematic diagrams of termination networks constructed in accordance with the present invention.
Figure 4:
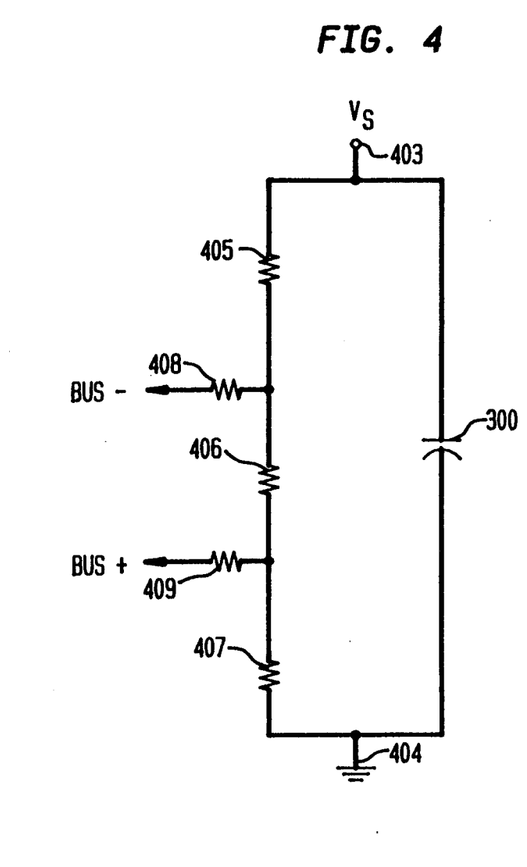
Figure 5:
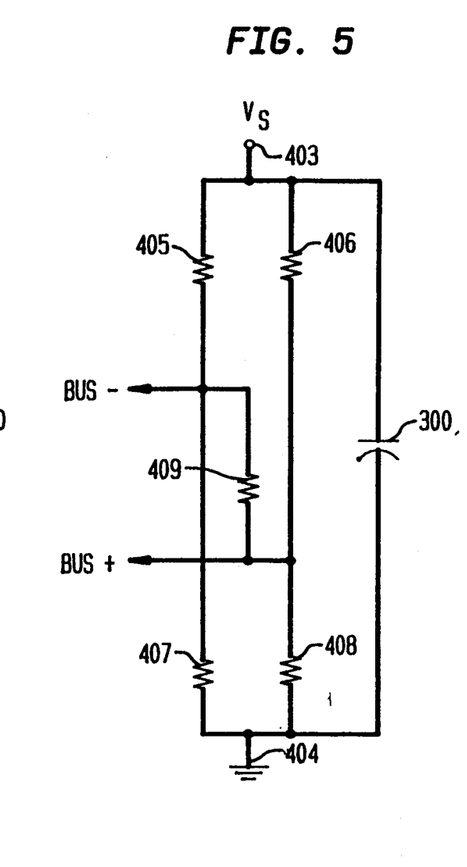

Three different forms of termination network are shown in FIGS. 3, 4, and 5. Each of the networks has a high frequency bypass capacitor 300 (normally some type of ceramic capacitor) connected between the top and bottom of the network circuit to effectively provide a very low impedance current path between the power supply and AC ground. If necessary a lower frequency tantalum capacitor can be placed in parallel with capacitor 300. In FIG. 3, a series combination of resistors 305, 306, and 307 are connected between terminals 303 and 304. The junction of resistors 305 and 306 is connected to lead 101 (BUS−) and the junction of resistors 306 and 307 is connected to lead 102 (BUS+). The termination network in FIG. 3 is attractive if two low impedance voltage sources $V_H$ and $V_L$ (with $V_H > V_L$) are available for use in supplying the bias voltages to terminals 303 and 304 respectively, Resistors 305 and 307 are each equal to $Z_{even}$ and resistor 306 is equal to the value which is necessary to place in parallel with $2 \times Z_{even}$ in order to obtain the value of $2 \times Z_{odd}$. The values of resistors 305–307 can be calculated using the following equations:

$$R_{305} = R_{307} = Z_{even}$$

$$R_{306} = \frac{2 Z_{odd} Z_{even}}{(Z_{even} - Z_{odd})}$$

As a result, both the even and odd modes of wave propagation will be properly terminated. The network of FIG. 3 has the advantage of using only three resistors as compared with the networks of FIGS. 4 and 5, but has the disadvantage of requiring the above-identified additional voltages just for the bus termination network.

A termination network that can operate from a single voltage supply having a reasonably arbitrary voltage of $V_S$ is shown in FIG. 4. In this network, resistors 405, 406 and 407 are connected in series from terminal 403 (to which the voltage supply is connected) and ground 404. A resistor 408 is connected between lead 101 (BUS−) and the junction of resistors 405 and 406, and a resistor 409 is connected between lead 102 (BUS+) and the junction of resistors 406 and 407. The values of the five resistors, 405–409, can be computed for a given voltage supply, $V_S$, the desired terminating impedances, $Z_{even}$ and $Z_{odd}$, and the desired voltages $V_−$ and $V_+$ on leads 101 (BUS−) and 102 (BUS+) respectively, using the following equations:

$$R_{406} = \frac{(2Z_{even} - 2Z_{odd})V_S V_{odd}}{(V_S - V_{odd})^2}$$

$$R_{405} = \frac{(2Z_{even} - 2Z_{odd})V_S(V_S - V_−)}{(V_S - V_{odd})^2}$$

$$R_{407} = \frac{(2Z_{even} - 2Z_{odd})V_S V_+}{(V_S - V_{odd})^2}$$

$$R_{408} = Z_{even} - R_{405}$$
$$R_{409} = Z_{even} - R_{407}$$

where $V_{odd} = (V_− - V_+)$.

The termination network shown in FIG. 5 is the most general of the three networks shown. Resistors 405, 406, 407 and 408 are connected in a conventional four node bridge arrangement with the voltage supply, $V_S$, connected between opposite nodes of the bridge by way of terminal 403 and ground terminal 404. The remaining opposite two nodes of the bridge are connected to leads 101 and 102. A fifth resistor 409 is also connected between the same opposite nodes as the two leads 101 and 102. Given the power supply voltage, $V_S$, the desired idle state bias voltages on leads 101 and 102, and the characteristic impedances $Z_{even}$ and $Z_{odd}$ for the bus, the values for the five resistors, 405–409, can be determined. Resistor 405 in parallel with resistor 407 must be equal to resistor 406 in parallel with resistor 408, and each parallel combination must be set equal to the $Z_{even}$ characteristic impedance for the bus. Resistor 409 has its value set accordingly to match the given $Z_{odd}$ and $Z_{even}$ of the bus. The specific values of resistors 405–409 are then picked in such a manner as to bias the bus with the desired idle bias voltage on each of the leads 101 and 102. The values for the resistors 405–409 can be computed using the following equations:

$$R_{409} = \frac{2Z_{odd}Z_{even}}{(Z_{even} - Z_{odd})}$$

$$R_{405} = \frac{R_{409}Z_{even}V_S}{[(V_- - V_+)Z_{even} + V_- R_{409}]}$$

$$R_{406} = \frac{V_S Z_{even} R_{409}}{[V_+ R_{409} + Z_{even}(V_+ - V_-)]}$$

$$R_{407} = \frac{Z_{even} R_{405}}{(R_{405} - Z_{even})}$$

$$R_{408} = \frac{Z_{even} R_{406}}{(R_{406} - Z_{even})}$$

Figure 7:
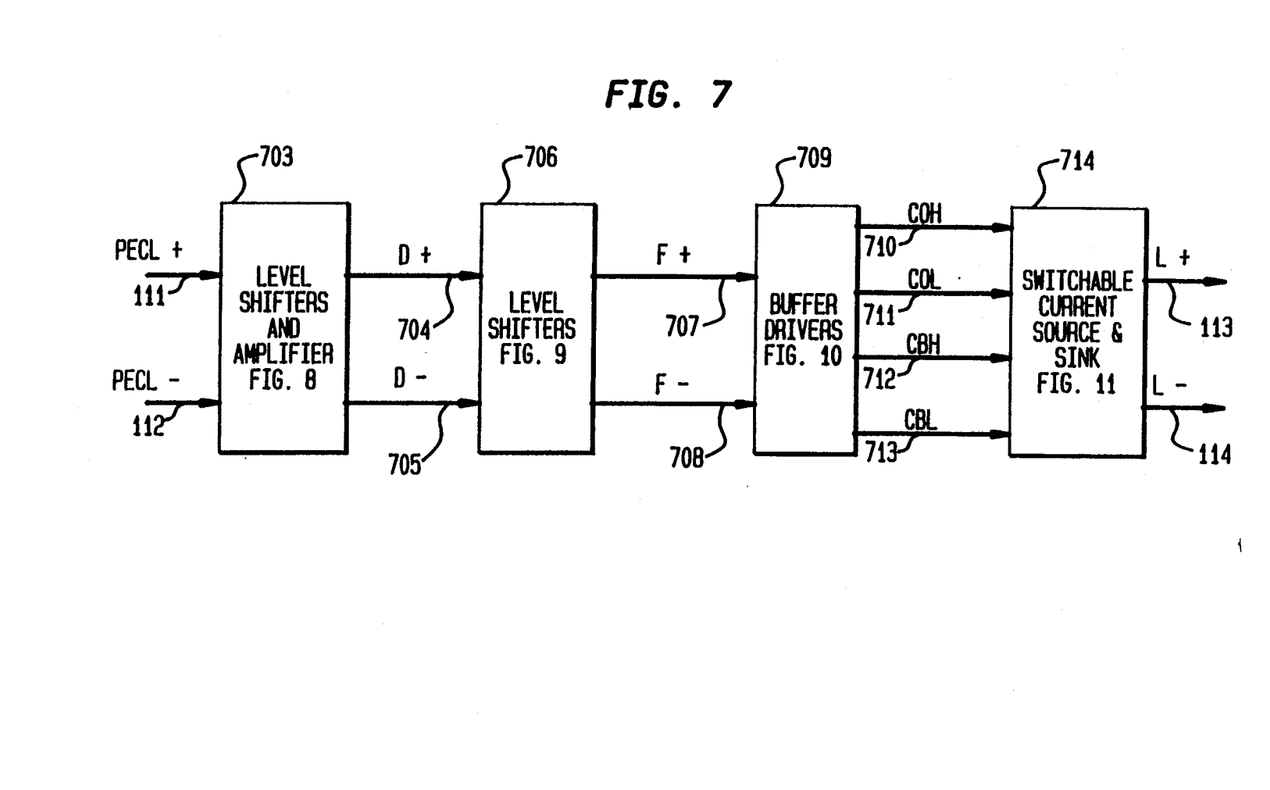

A current mode bus driver of the type useful in coupling pseudo or positive emitter coupled logic (PECL) signals to the backplane bus disclosed herein above is shown in FIG. 7. As indicated in FIG. 7, the circuits of FIGS. 8, 9, 10 and 11 are connected in tandem as shown to provide an apparatus which causes the PECL differential voltage signals to operate the signal leads L+ and L− of the BUS. The operation of the entire current mode bus driver circuit of FIG. 7 will be more readily understood after reading the following detailed description of the operation of the individual circuits of FIGS. 8–11.

As pointed out herein above, the essential characteristic of the current mode bus driver of FIG. 7 is to supply a current source to one signal lead of the bus and a current sink to the other signal lead of the bus for an input binary value of one type, and to isolate the current source and sink from the bus for an input binary value of the other type. The part of the apparatus in FIG. 7 which accomplishes this task is present in the circuit of FIG. 11, and it is therefore most useful in obtaining an understanding of the current mode bus driver to discuss this circuit first. The remaining circuits of FIGS. 8–10 simply modify the voltage levels of the PECL signals at the input of the FIG. 7 circuit and increase their power level to the point where they can effectively switch the current source and sink at a high rate of speed with signals on lines 710–713 at the input of block 714 in FIG. 7.

Figure 11:
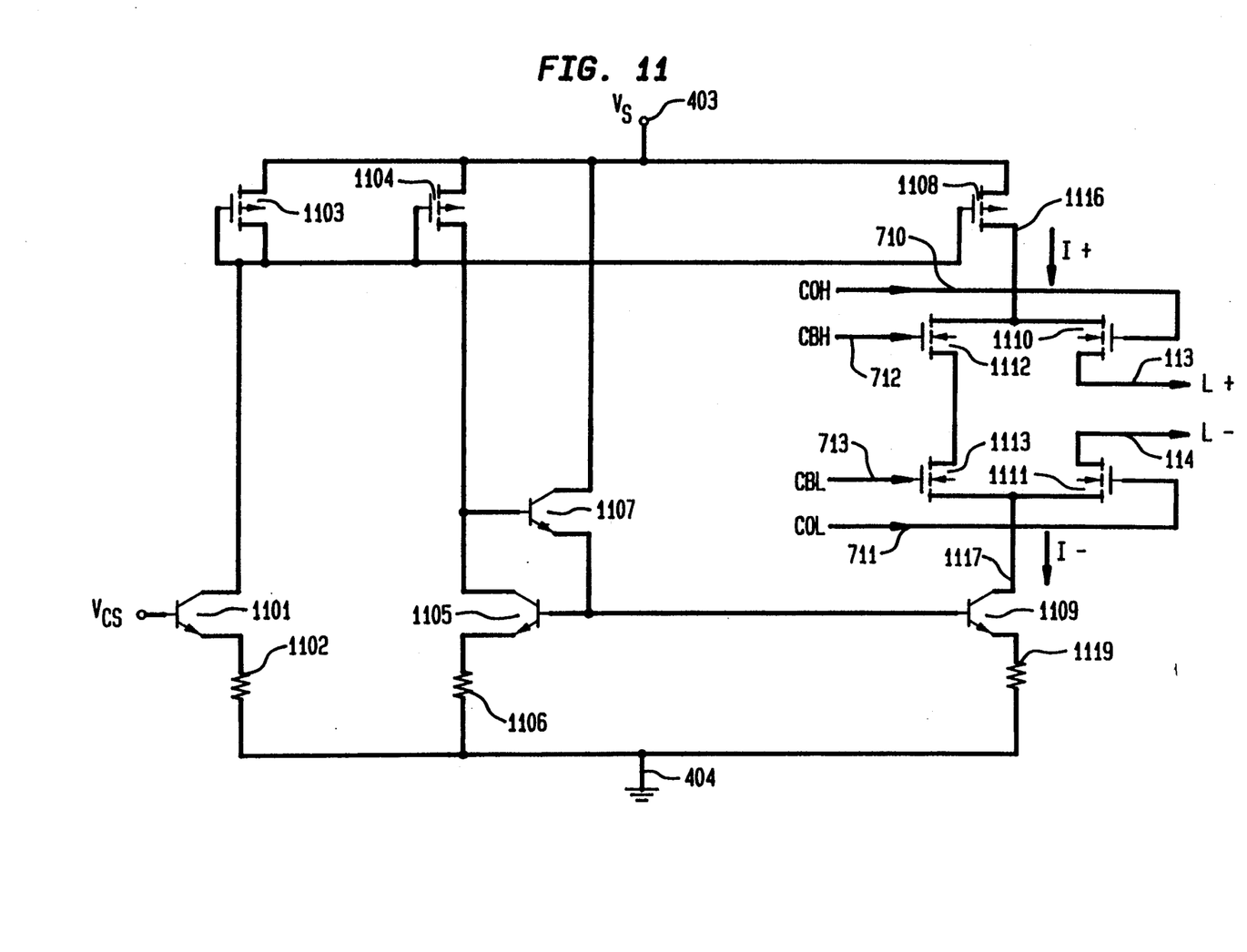

In FIG. 11, a fixed reference potential, $V_{CS}$, is coupled to the base of an NPN transistor 1101 whose emitter is connected through a resistor 1102 to ground thereby establishing a reference current into the collector of transistor 1101. The collector of transistor 1101 is connected to, and the reference current is drawn from, the drain of a metal oxide semiconductor field effect transistor (MOSFET) 1103 of the p-channel enhancement type. The gate of MOSFET 1103 is also connected to its drain, and its source electrode is connected to positive potential source 403, $V_S$, which in the present embodiment is equal to 5.0-volts. A MOSFET 1104 of the p-channel enhancement type also has its source electrode connected to the potential source 403 of $V_S$, and has its gate electrode connected to the gate electrode of MOSFET 1103. As will be appreciated by those skilled in the art, MOSFET's 1103 and 1104 are connected in a current mirror arrangement whereby the current out of the drain of MOSFET 1104 is related to the current out of the drain of MOSFET 1103 by the Patio of the widths of the gate electrodes. Since the current out of the drain of MOSFET 1103 is only used as a reference current, it is set, by choosing the value of resistor 1102, equal to about one-fourth the current out of the drain of MOSFET 1104 in order to reduce the amount of power consumed. In the present embodiment, the desired current is equal to about 10 ma., and the reference current is equal to about 2.5 ma. Accordingly, the width of the Mate electrode of MOSFET 1104 is chosen to be equal to four times the width of the gate electrode of MOSFET 1103.

A MOSFET 1108 of the p-channel enhancement type also has its source electrode connected to the potential source, $V_S$, and its gate electrode connected to the gate electrode of MOSFET 1103 with a gate electrode width equal to that of MOSFET 1104. As a result a mirrored current of about 10 ma. is available from the drain of MOSFET 1108 on line 1116. This is the current which in selected cases will be switched in a manner to be described hereinafter onto signal lead 102 (L+) of the BUS.

To provide a current sink, the mirrored current out of the drain of MOSFET 1104 is coupled into the collector electrode of an NPN transistor 1105. The collector of transistor 1105 is connected to its base electrode through the base-emitter junction of an NPN transistor 1107, the collector electrode of which is connected to the potential source, $V_S$. The emitter of transistor 1105 is connected through a resistor 1106 to ground. An NPN transistor 1109 with an emitter area equal to that of transistor 1105 has its base electrode connected to the base of transistor 1105, and its emitter electrode connected to ground through a resistor 1119 substantially equal in value to resistor 1106. Those skilled in the art will recognize the circuit arrangement provided by transistors 1105, 1107 and 1109 as a current mirror which provides a current sink at the collector of transistor 1109 for a current, I−, on line 1117 equal in value to the current being driven into the collector of transistor 1105. As pointed out herein above, this current into the collector of transistor 1105 is equal in value to the current, I+, on line 1116, and therefor the magnitude of current source of I+ is substantially equal to the magnitude current sink of I−.

The current, I+, on line 1116 is connected to the drain of an n-channel enhancement type MOSFET 1110 whose source is connected to signal lead 102 (L+) and whose gate is connected to receive a digital signal (COH) present on line 710. When the gate of MOSFET 1110 is hard driven with a sufficiently high positive potential, the current, I+, is coupled through to signal lead 102 (L+) of the BUS. Similarly, the current, I−, on line 1117 is connected to the source of an n-channel enhancement type MOSFET 1111 whose drain is connected to signal lead 101 (L−) of the BUS and whose gate is connected to receive a digital signal (COL) on line 711. When the gate of MOSFET 1111 is hard driven with a sufficiently high positive potential, signal lead 101 (L−) of the BUS is connected through to the current sink, I−, on line 1117.

The current, I+, on line 1116 is also connected to the drain of a n-channel enhancement type MOSFET 1112 whose gate is connected to receive a digital signal (CBH) on a line 712. The source of MOSFET 1112 is directly connected to the drain of an n-channel enhancement type MOSFET 1113 whose gate is connected to receive a digital signal (CBL) on line 713 and whose source is connected to the current sink, I−, on line 1117. When the gates of MOSFET's 1113 and 1114 are hard driven by a sufficiently high positive potential on line 712 (CBH) and line 713 (CBL), the current source I+ is coupled through the MOSFET's 1112 and 1113 to the current sink I−. As a result, by operating COH and COL out of phase with CBH and CBL, the current source and current sink can be rapidly switched between the signal leads of the BUS and isolated from the BUS without introducing large transient effects. Consequently, the circuit of FIG. 11 can be driven by signals from any other type logic system such as ECL or PECL by translating the signals from that other logic system into signals on lines 710–713 with the correct polarity and sufficient power to operate the switches represented by MOSFET's 1110–1113.

Figure 10:
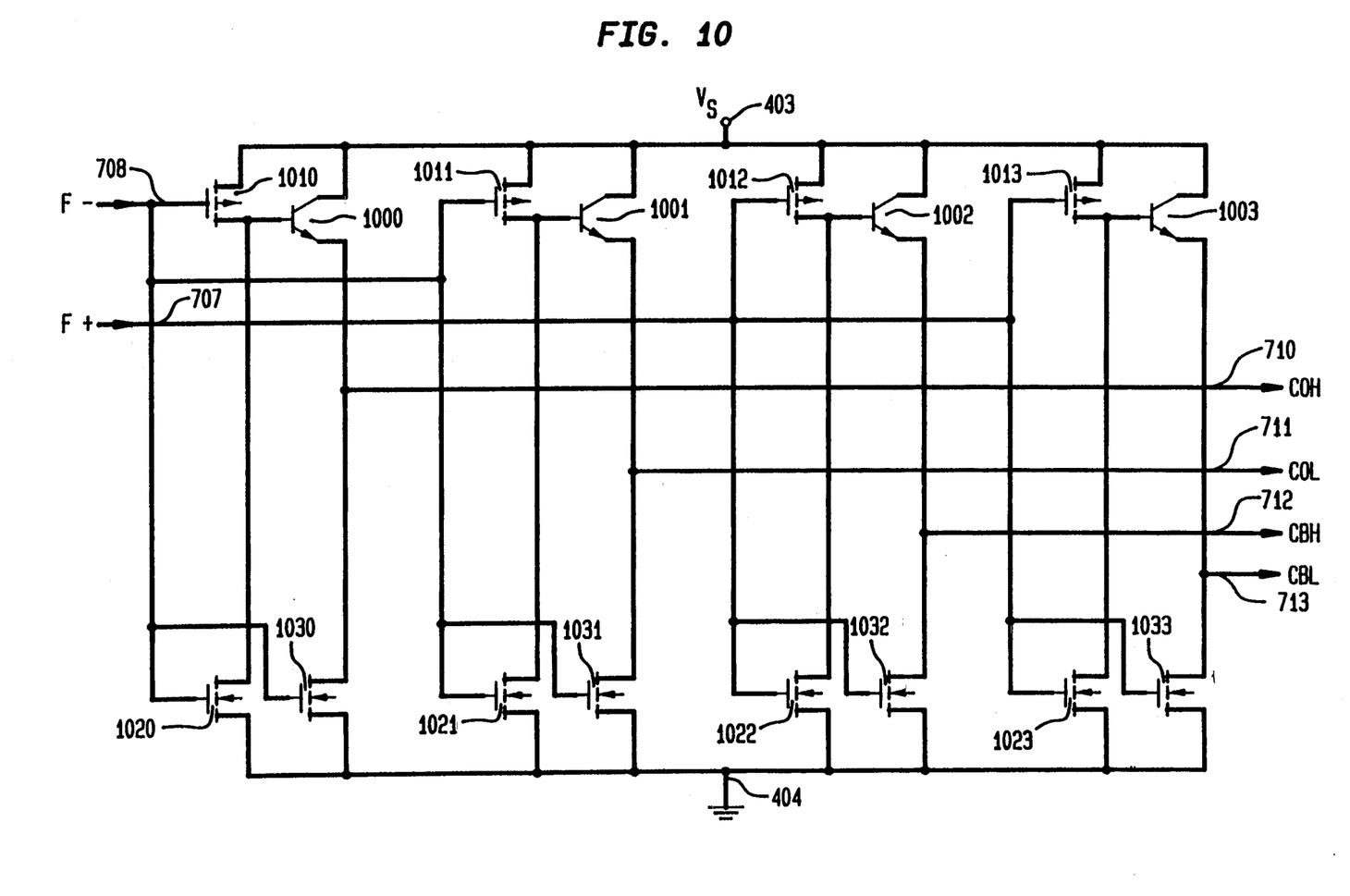

The amount of current required to drive the MOSFET switches into saturation at a rapid rate is quite high, in the order of 6 ma. peak current. The circuit of FIG. 10 has four novel buffers which can advantageously provide this high peak current on lines 710–713 in response to two input digital signals F+ and F− on lines 707 and 708 respectively. In FIG. 10, lines 710–713 are each connected to the emitter of an NPN transistor 1000–1003 respectively. The collector electrodes of these transistors 1000–1003 are all connected to the positive potential source 403 of $V_S$. P-channel enhancement type MOSFET's 1010–1013 are connected with n-channel enhancement type MOSFETs 1020–1023 to form four standard complementary metal oxide semiconductor (CMOS) inverters. The base electrode of each of the NPN transistors is connected to the output of one of these inverters. Consequently, if the gate of any one of the MOSFETs 1010–1013 is driven with a sufficiently low voltage relative to the positive potential source, $V_S$, the MOSFET drives its respective NPN transistor toward conduction and the corresponding MOSFET switch in FIG. 11 is closed. As shown in FIG. 10, MOSFET's 1010 and 1011 are driven by the F− signal on line 708 whereas MOSFET's 1012 and 1013 are driven by the F+ signal on line 707.

In the present embodiment each F signal has a voltage transition of about 2.0 volts centered about 2.5 volts, that is, each F signal swings between 1.5 and 3.5 volts. With a signal potential of about 3.5 volts on either of the lines 707 or 708, the corresponding p-channel MOSFET (1010–1013) passes so little current that the corresponding NPN transistor is no longer able to conduct since the corresponding n-channel MOSFET (1020–1023) is driven toward saturation by the 3.5 volts thereby effectively removing current which would otherwise flow into the base electrode of the corresponding NPN transistor.

Finally the circuit of FIG. 10 must remove current from the gate electrodes of the MOSFET switches of FIG. 11 when the switch is intended to be turned off. To accomplish this task n-channel enhancement type MOSFET's 1030–1033 each has its drain electrode connected to one of the lines 710–713 respectively, and its source connected to ground. The gate of each of the MOSFET's 1030–1033 is connected to the F signal driving its respective switch in FIG. 11. Consequently, when the F− signal on line 708 is driven to the 3.5 volt level, MOSFET's 1030 and 1031 are driven toward saturation thereby causing MOSFET switches 1110 and 1111 in FIG. 11 to be turned off. Similarly, when the F+ signal is driven to the 3.5 volt level, MOSFET's 1032 and 1033 are driven toward saturation thereby causing MOSFET switches 1112 and 1113 in FIG. 11 to be turned off. In summary, the low level of 1.5 volt for the F− signal on line 708 causes the circuit of FIG. 11 to connect the current source and sink to the signal lines 102 and 101 of the BUS, and the low level of 1.5 volt for the F+ signal on line 107 causes the current source and sink to be connected together and isolated from the BUS. The high level signal of 3.5 volt on either of the F signals causes its corresponding MOSFET switch to be rapidly turned off.

To summarize thus far, differential voltage digital signals represented by F+ and F− on lines 707 and 708 respectively can be used to drive a $D^2L$ bus of the type disclosed herein above. As indicated herein above, the F signals have a 2.0 volt swing around a median value of about 2.5 volts. Those skilled in the art can use this information to design circuits which can translate any one of the well known digital formats into F signals that can be used to drive the FIGS. 10 and 11 apparatus. The current mode bus driver shown in FIG. 7 uses input signals on lines 111 and 112 from a positive or pseudo ECL (PECL) system. Each PECL signal has a swing of about 0.8 volts around a median voltage of about 3.6 volts. The function of the remainder of the circuits shown in FIGS. 8 and 9 is to translate the input PECL signals into F signals on lines 707 and 708 which can properly drive the buffer driver circuits of FIG. 10.

Figure 8:
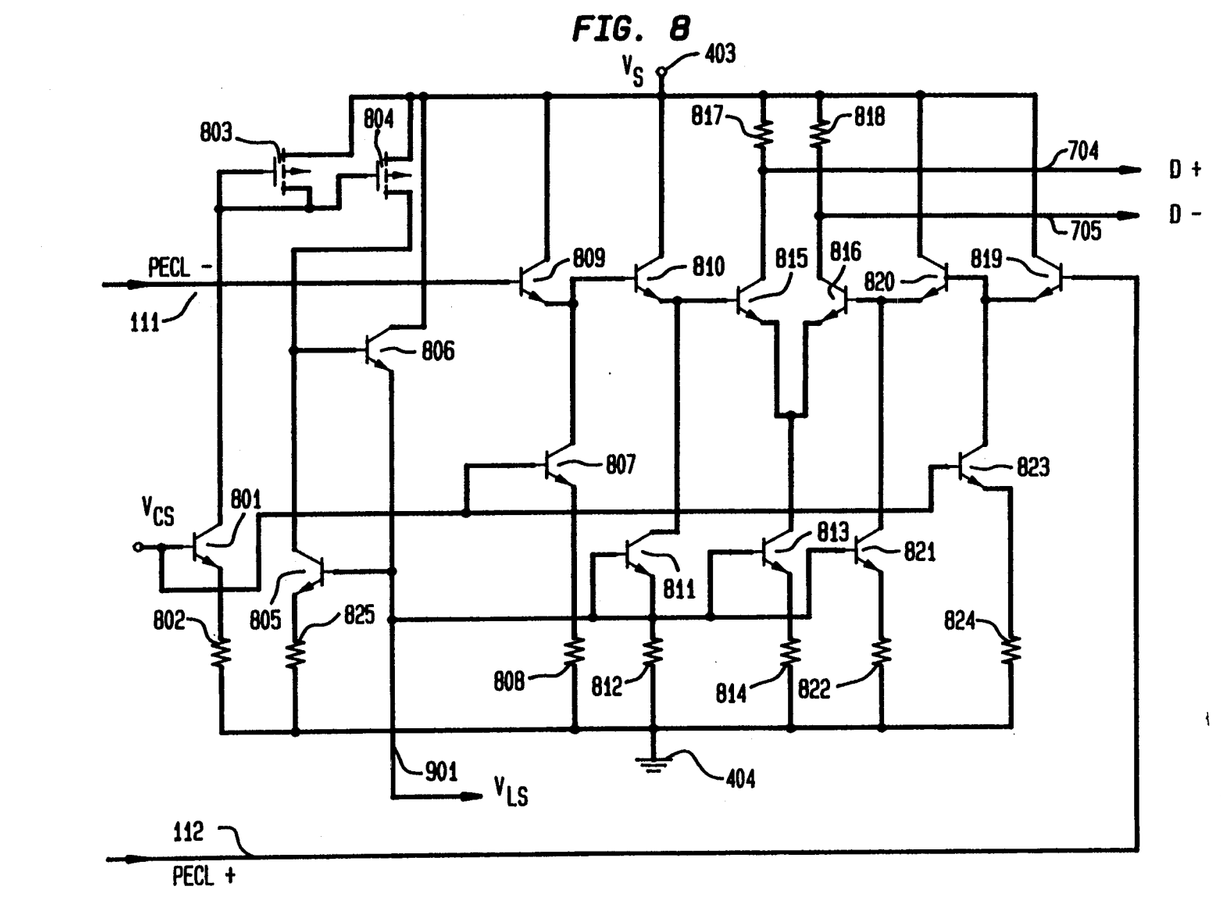
FIGS. 8–11 when placed in tandem as shown in FIG. 7 with identical leads joining provide a schematic diagram of a current mode bus driver useful in practicing the present invention.
Figure 9:
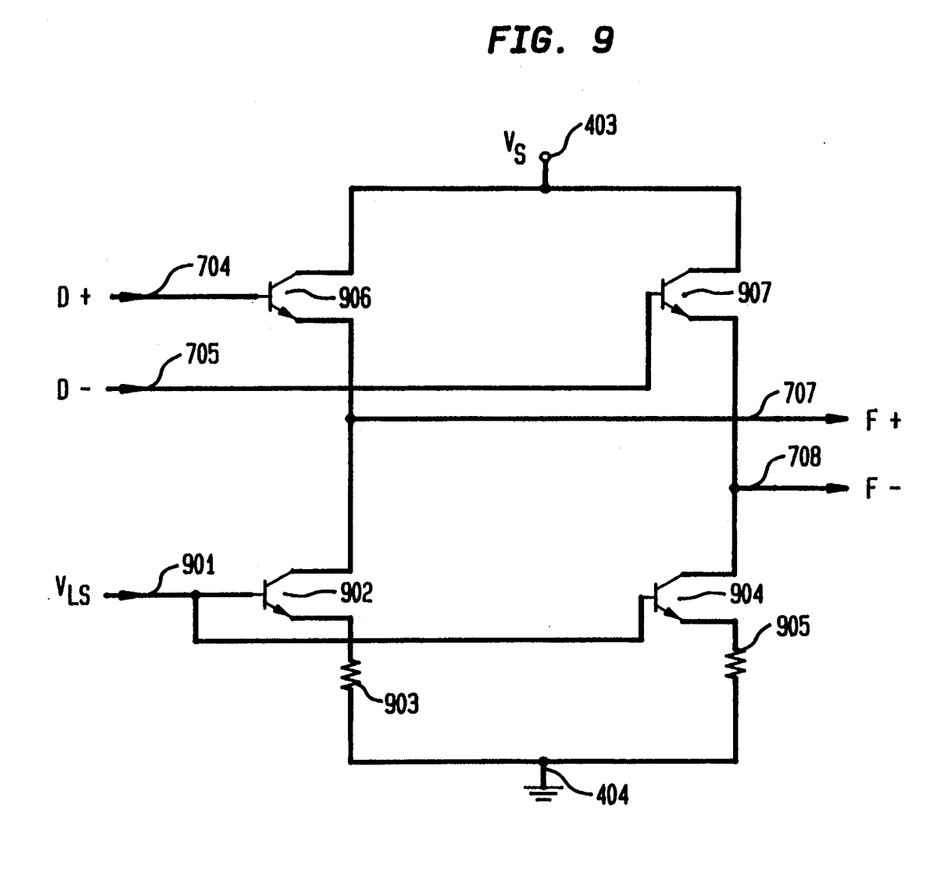

In FIG. 8, the fixed reference potential ($V_{CS}$) of about 1.8 volts is connected to the base of an NPN transistor 801. The emitter of transistor 801 is connected through a resistor 802 to ground and its collector is connected to the drain of a p-channel enhancement type MOSFET 803. MOSFET 803 is connected with a p-channel enhancement type MOSFET 804 in a current mirror arrangement which functions in a fashion identical to that of the current mirror arrangement discussed herein above in connection with MOSFET's 1103 and 1104. As a result, the reference current established into the collector of transistor 801 is mirrored out of the drain of MOSFET 804, and this mirrored current is coupled into the collector of an NPN transistor 805 which in turn is connected with transistor 806 and resistor 825 in an arrangement which functions in a fashion identical to that described herein above with respect to elements 1105–1107 in FIG. 11. As a result, a reference potential, $V_{LS}$, is established on line 901 at the base of transistor 805.

The fixed reference potential, $V_{CS}$, is also connected to the base electrodes of transistors 807 and 823 each of which has its emitter electrode connected through a resistor (808 and 824 respectively) to ground. The current into the collector of transistor 807 is drawn from the emitter of an NPN transistor 809 whose collector is connected to the 5.0 volt potential source 403 and whose base is connected to line 111 to receive the PECL− signal. The emitter follower stage formed by transistor 809 simply drops the PECL− signal by about 1 volt. In a similar fashion an NPN transistor 819 provides an emitter follower stage with the current into the collector of transistor 823 to receive and drop the potential of the PECL+ signal on line 112.

The reference potential of $V_{LS}$ on the base of transistor 805 is coupled to the bases of NPN transistors 811, 813, and 821 each of which has its emitter electrode connected through resistors 812, 814 and 822, respectively, to ground thereby forming three more current sinks into their collector electrodes. The NPN transistors 810 and 820 are connected to two of these current sinks to form two additional emitter followers that serve to drop the PECL− and PECL+ signals out of the first emitter follower stages by an additional one volt. The resulting digital signals at the emitters of transistors 810 and 820 are now centered around a potential of about 1.6 volts as compared with the 3.6 volt of the original PECL signals.

The current into the collector of transistor 813 is drawn from the emitter electrodes of NPN transistors 815 and 816 each of which has its collector electrode connected through a resistor 817 and 818, respectively, to form a differential amplifier stage. This differential amplifier stage has its inputs (bases of transistors 815 and 816) connected to receive the signals at the emitters of transistors 810 and 820. The amplified signals are the D+ and D− signals provided on the lines 704 and 705 in FIG. 7. These amplified D signals have about a 2 volt swing centered around about 3.5 volts.

In FIG. 9, the reference potential of $V_{LS}$ from FIG. 8 is connected by way of line 901 to the base electrodes of NPN transistors 902 and 904 each of which has its emitter electrode connected through a resistor 903 and 905, respectively, to ground. The resulting current sinks into the collectors of transistors 902 and 904 are drawn from the emitters of NPN transistors 906 and 907 each of which has its collector electrode connected to positive potential source 403 in order to form two additional emitter follower stages. The D+ and D− signals on lines 104 and 105 are coupled to the base electrodes of transistors 906 and 907, respectively. As a result the amplified digital D signals from FIG. 8 are dropped by about an additional one volt to now provide the F+ and F− signals on lines 707 and 708 respectively. As pointed out herein above these F signals are now centered about 2.5 volts with a swing of about 2 volts and are now of the proper potential and magnitude to drive the buffer driver circuits of FIG. 10.

Figure 12:
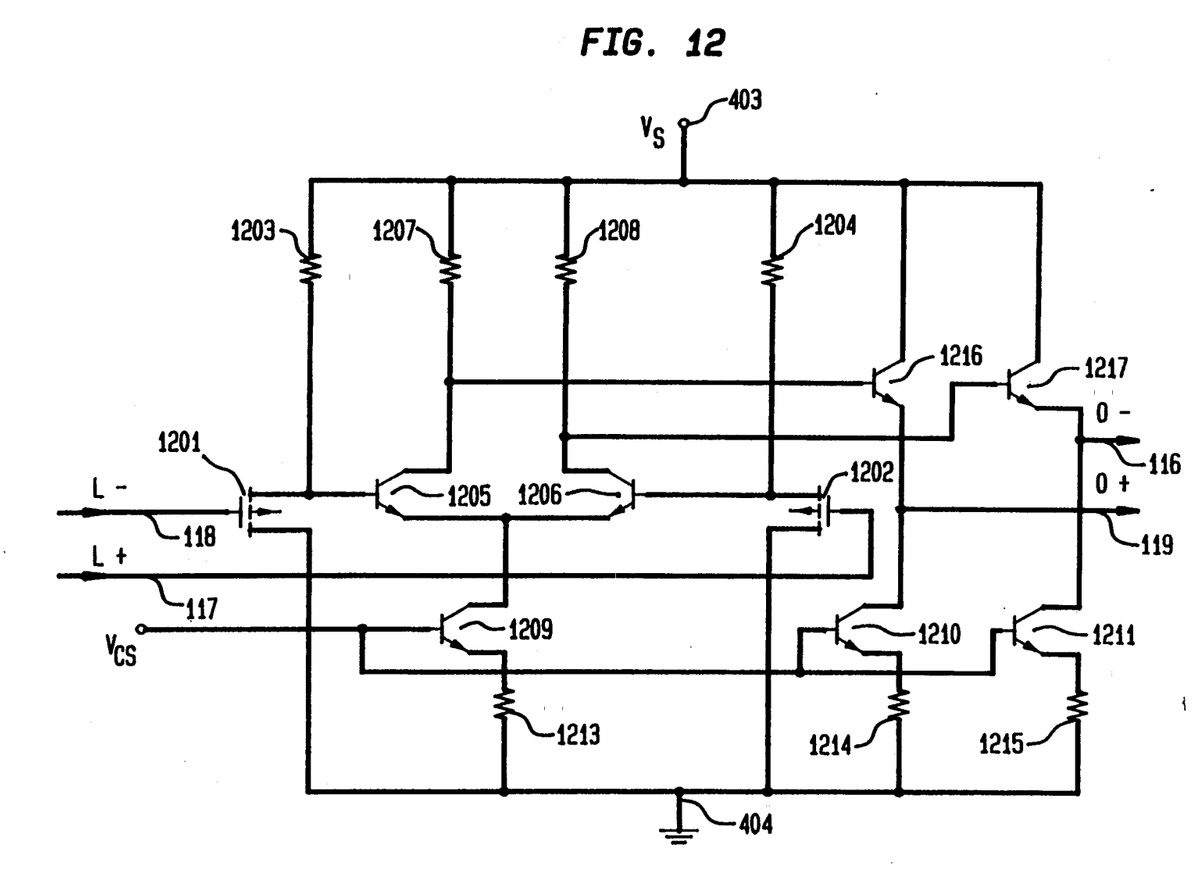
FIG. 12 is a schematic diagram of a differential receiver useful in practicing the present invention.

A schematic diagram of one type of differential receiver 115 is shown in FIG. 12. In FIG. 12, leads 117 and 118 from the L+ and L− leads of the bus are connected to the gates of p-channel enhancement type MOSFETs 1201 and 1202, respectively, each of which has its drain electrode connected to ground potential 404. The source electrodes of MOSFETs 1201 and 1202 are connected through resistors 1203 and 1204, respectively, to the positive potential source 403 of $V_S$. The small signal ac gain of the p-channel source follower provided by each of the MOSFETs 1201 and 1202 is given by the following equation:

$$\text{Gain} = -\frac{RG}{RG + 1}$$

where R is the value of the resistor between the source and the positive potential source, and G is the transconductance of the MOSFET. By enlarging the width of the gate of the MOSFET to create a large transconductance and by using a large value of resistance for the resistor, the effects of both temperature and chip processing on the gain of the stage can be minimized.

The above-mentioned fixed potential source $V_{CS}$ is connected to the base electrodes of NPN transistors 1209, 1210, and 1211 each of which has its emitter electrode connected through resistors 1213, 1214, and 1215, respectively, to ground potential 404 in order to form three current sinks at the collectors of these NPN transistors. The current into the collector of transistor 1209 is drawn from the emitters of two NPN transistors 1205 and 1206 which have their collectors connected to the positive potential source 403 through resistors 1207 and 1208 respectively to form a differential amplifier. With the bases of transistors 1205 and 1206 connected to the source electrodes of MOSFETs 1201 and 1202, an amplified version of the signal present on the bus is available at the collector electrodes of transistors 1205 and 1206.

The currents into the collectors of transistors 1210 and 1211 are drawn from the emitters of NPN transistors 1216 and 1217, respectively, each of which has its collector connected to the positive potential source 403 to form two emitter followers. The bases of transistors 1216 and 1217 are connected to the collector electrodes of transistors 1205 and 1206 to couple the amplified bus signal from the differential amplifier to the output leads 119 and 116 at the emitter electrodes of transistors 1216 and 1217, respectively. These differential voltage signals at the outputs of the emitter followers can of course be further modified using circuits similar to those discussed herein above in connection with the current mode bus driver circuit to change the signals into any one of the popular differential voltage bus signals such as those used with ECL or PECL.

What has been described herein above is an illustrative embodiment of the present invention. Numerous departures may be made by those skilled in the art without departing from the spirit and scope of the present invention. For example, other forms of bus drivers may be constructed to enable a bus master to change the differential voltages on the bus in accordance with the input digital signals. These other forms of bus drivers need not utilize current sources and sinks even though that is the preferred embodiment.

What is claimed is:

1. A backplane bus for differential signals having two signal leads for each input digital bit to be transmitted over said bus, said backplane bus comprising network means at each end of said two signal leads for terminating said two signal leads in their characteristic impedances, means for coupling said input digital bit to said two signal leads as a difference in voltage between said two signal leads, and differential receiver means having its input connected to said two signal leads for translating the difference in voltage between said two leads into a binary one or zero, characterized in that said network means also provides said two signal leads with a different D.C. voltage on each lead such that the difference in voltage between said two leads is detected by said differential receiver as a binary value of one type, and said means for coupling said input digital bit to said two signal leads includes a circuit having an input and an output which provides a current source to one of said two leads and a current sink to the other one of said two leads only when its input is presented with a digital bit having a binary value of the other type.

2. A backplane bus as defined in claim 1 wherein said network means includes four impedances connected in a bridge arrangement to form two pairs of opposite nodes, means for coupling a source of D.C. potential to one of said two pairs of opposite nodes, means for connecting the other one of said two pairs of opposite nodes to one end of said two signal leads, and a fifth impedance connected between said other one of said two pairs of opposite nodes.

3. A backplane bus as defined in claim 1 wherein said network means includes first, second and third impedances connected in series to form a series arrangement with a first junction between said first and second impedances and a second junction between said second and third impedances, means for connecting the series arrangement of said first, second, and third impedances across a source of D.C. potential, a fourth impedance connected between said first junction and one of said two signal leads, and a fifth impedance connected between said second junction and the other one of said two signal leads.

4. A backplane bus as defined in claim 1 wherein said network means includes first, second and third impedances connected in series to form a series arrangement with a first junction between said first and second impedances and a second junction between said second and third impedances, means for connecting the series arrangement of said first, second, and third impedances between two sources of different D.C. potential, means for connecting said first junction directly to one of said two signal leads, and means for connecting the second junction to the other one of said two signal leads.

5. In a digital backplane bus wherein the two binary states of each bit is represented by differences in voltage between two signal leads each one of which has two ends, the subcombination comprising means for terminating said two signal leads at both ends in their characteristic impedances while placing a different D.C. voltage on each one of said two signal leads such that the difference in voltage represents one of said two binary states, and driver means having an input for coupling a current into one of said two signal leads while coupling a current out of the other one of said two signal leads in response to a voltage difference at its input representing the other one of said two binary states.

6. In a subcombination as defined in claim 5 wherein said means for terminating said two signal leads includes four impedances connected in a bridge arrangement to form two pairs of opposite nodes, means for coupling a source of D.C. potential to one of said two pairs of opposite nodes, means for connecting the other one of said two pairs of opposite nodes to one end of said two signal leads, and a fifth impedance connected between said other one of said two pairs of opposite nodes.

7. In a subcombination as defined in claim 5 wherein said means for terminating said two signal leads includes first, second and third impedances connected in series to form a series arrangement with a first junction between said first and second impedances and a second junction between said second and third impedances, means for connecting the series arrangement of said first, second, and third impedances across a source of D.C. potential, a fourth impedance connected between said first junction and one of said two signal leads, and a fifth impedance connected between said second junction and the other one of said two signal leads.

8. In a subcombination as defined in claim 5 wherein said means for terminating said two signal leads includes first, second and third impedances connected in series to form a series arrangement with a first junction between said first and second impedances and a second junction between said second and third impedances, means for connecting the series arrangement of said first, second, and third impedances between two sources of different D.C. potential, means for connecting said first junction directly to one of said two signal leads, and means for connecting the second junction to the other one of said two signal leads.

9. A backplane bus for differential signals having two signal leads for each input digital bit to be transmitted over said bus, said backplane bus comprising network means at each end of said two signal leads for terminating said two signal leads in their characteristic impedance, means for coupling said input digital bit to said two signal leads as a difference in voltage between said two signal leads, and differential receiver means having its input connected to said two signal leads for translating the differences in voltage between said two leads into a binary one or zero, characterized in that said network means also provides said two signal leads with a different D.C. voltage on each lead such that the difference in voltage between said two leads is detected by said differential receiver as a binary value of one type, and said means for coupling said input digital bit to said two signal leads includes a circuit having an input and an output which is isolated from said two leads when its input is presented with said binary value of one type and which switches the difference in voltage between said two leads when its input is presented with a digital bit having a binary value of the other type.

10. A backplane bus as defined in claim 9 wherein the circuit included in said means for coupling said input digital bit to said two signal leads includes a current source which is switchably connected to one of said two leads and a current sink which is switchably connected to the other of said two leads only when the input of the circuit is presented with a digital bit having a binary value of the other type.

* * * * *